United States Patent [19]

Tomita et al.

[11] Patent Number: 5,783,162
[45] Date of Patent: Jul. 21, 1998

[54] ARGON PURIFICATION PROCESS

[75] Inventors: Shinji Tomita; Takashi Nagamura; Takao Yamamoto, all of Hyogo-ken, Japan

[73] Assignee: Teisan Kabushiki Kaisha, Tokyo, Japan

[21] Appl. No.: 705,696

[22] Filed: Aug. 30, 1996

[30] Foreign Application Priority Data

Sep. 5, 1995 [JP] Japan ................................. 7-228106

[51] Int. Cl.$^6$ ............................ C01B 13/00; C01B 33/02
[52] U.S. Cl. ............................ 423/348; 423/219; 423/350
[58] Field of Search ............................ 423/219, 351, 423/348, 350

[56] References Cited

U.S. PATENT DOCUMENTS

| | | |
|---|---|---|
| 4,623,524 | 11/1986 | Someya et al. . |
| 4,762,542 | 8/1988 | Mishkovsky et al. . |
| 4,859,435 | 8/1989 | Roberts et al. ............ 423/351 |
| 5,441,719 | 8/1995 | Nagamura et al. ............ 423/351 |
| 5,607,572 | 3/1997 | Joshi ............ 423/219 |

FOREIGN PATENT DOCUMENTS

| | | |
|---|---|---|
| 0 509 871 | 10/1992 | European Pat. Off. . |
| 589766 | 3/1994 | European Pat. Off. . |
| 2 429 181 | 1/1980 | France . |
| 2-272228 | 11/1990 | Japan . |
| 3-134482 | 6/1991 | Japan . |
| 2 053 878 | 2/1981 | United Kingdom . |

Primary Examiner—Wayne Langel
Attorney, Agent, or Firm—Young & Thompson

[57] ABSTRACT

An argon recovery and purification process in which the consumption of energy is small because of simple steps, is provided. This process comprises: a first step of reacting impure argon gas with hydrogen gas (H2) so that oxygen (O2) contained in the impure argon gas is converted to water (H2O), thereby substantially removing oxygen (O2) from the impure argon gas; a second step of introducing the impure argon gas into an adsorption unit for adsorbing water (H2O) and carbon dioxide (CO2) contained in the impure argon gas, thereby substantially removing the water (H2O) and carbon dioxide (CO2) from the impure argon gas; and a third step of subjecting the impure argon gas to a low temperature liquefaction and introducing the liquefied argon into a rectification unit for removing low boiling point impurity components and high boiling point impurity components contained in the impure argon gas by purification and separation, thereby obtaining substantially pure argon gas.

5 Claims, 1 Drawing Sheet

ARGON PURIFICATION PROCESS

FIELD OF THE INVENTION

The present invention relates to a process for recovering and purifying argon in a semiconductor manufacturing process, and particularly to a process for recovering and purifying argon from a pull-up furnace in a monocrystalline silicon ingot manufacturing line.

BACKGROUND OF THE INVENTION

Into a silicon furnace for manufacturing silicon ingots, a large amount of argon gas is supplied as an inert gas. This argon gas is discharged from the silicon furnace as it contains a gas mainly consisting of N2 and O2 generated in the manufacture of silicon ingots and further contains hydrocarbons such as CH4. Argon gas is obtained by concentrating and purifying argon existing in an amount of 0.93% in air through very low temperature separation, and it is therefore expensive. Accordingly, it is preferred to purify impure argon gas discharged in a large amount from a silicon furnace so that argon gas is obtained.

Studies on a process for purifying argon gas mixed with substances other than argon to obtain pure argon gas have been hitherto carried out. For example, in J-A-63-189,774, J-A-01-230,975, J-A-02-272,288 and J-A-05-256,570, there are disclosed processes which comprise removing CO, CO2, H2O gases from impure argon gas by desorption and then purifying the impure argon through very low temperature separation or a catalytic reaction to obtain purified argon gas. Furthermore, in J-A-02-282,682 and J-A-03-39,886 and further JB-05-012,393 and JB-05-029,834, there are disclosed argon recovery processes which includes a step of converting CO, H2 and hydrocarbons to H2O and CO2 by use of a catalyst.

U.S. Pat. No. 4,623,524 describes a process for obtaining argon from a silicon furnace including an oxidation step, a combustion step, a deoxo-step, an absorption step, and a distillation step.

In the impure argon gas purification and recovery processes described in each of the aforementioned documents, an oxidation treatment based on a catalytic reaction is carried out on hydrocarbons contained in impure argon gas, thereby converting these hydrocarbons to substances such as H2O and CO2. At that time, an excess of oxygen gas (O2) is required for this reaction, and this oxygen is subsequently supplied to the impure argon gas. However, this causes an excess of oxygen to exist in the impure argon gas. In order to separate this oxygen from the impure argon gas, there is usually adopted a process which comprises reacting O2 with H2 so that said oxygen is converted to H2O, and then removing this H2O, where a larger amount of hydrogen is required. In addition, this catalytic reaction requires an external heat source, and it will be therefore concluded that this process is not satisfactory from the viewpoint of energy efficiency.

Due to consideration of the aforementioned situation, the present invention is intended to provide an argon recovery and purification process in which the consumption of energy is small because of simple steps.

SUMMARY OF THE INVENTION

According to the present invention, there is provided an argon recovery and purification process which comprises purifying impure argon gas discharged from a silicon furnace and containing as impurities low boiling point impurity components whose boiling points are lower than that of argon such as oxygen and nitrogen and high boiling point impurity components whose boiling points are higher than that of argon such as hydrocarbons to obtain pure argon gas substantially consisting of argon, and supplying said pure argon gas to the silicon furnace again. The process is characterized by having: a first step of adding hydrogen into said impure argon gas, where said hydrogen is reacted with oxygen contained in the impure argon gas so as to be converted to water, thereby substantially removing the oxygen from said impure argon gas; a second step of introducing said impure argon gas into an adsorption means, where said adsorption means is caused to adsorb water and carbon dioxide contained in said impure argon gas, thereby substantially removing the water and carbon dioxide from said impure argon gas; and a third step of subjecting said impure argon gas to a low temperature liquefaction and introducing the liquefied argon into a rectification means which removes said low boiling point impurity components and high boiling point impurity components contained in said impure argon gas by purification and separation, thereby obtaining pure argon gas substantially consisting of argon.

An argon recovery and purification process according to the present invention may be characterized in that said rectification means comprises a first rectification column for substantially removing said low boiling point impurity components from said impure argon gas and a second rectification column for substantially removing said high boiling point impurity components from said impure argon gas introduced from the first rectification column.

According to the present invention, there is also provided an argon recovery and purification unit in which impure argon gas discharged from a silicon furnace and containing as impurities low boiling point impurity components whose boiling points are lower than that of argon such as oxygen and nitrogen and high boiling point impurity components whose boiling points are higher than that of argon such as hydrocarbons is purified to obtain pure argon gas substantially consisting of argon, and said pure argon gas is supplied to the silicon furnace again. The unit comprises a deoxo means having a deoxidation catalyst for accelerating a reaction of reacting oxygen (O2) with hydrogen gas (H2) so that the hydrogen gas is converted to water, where hydrogen gas (H2) is added into said impure argon gas introduced here so that said hydrogen gas is reacted with oxygen (O2) so as to be converted to water, thereby substantially removing the oxyen (O2) from said impure argon gas; a cooling means for cooling down said impure argon gas which has been substantially freed of oxygen by said deoxo means; a decarbonating and drying means for substantially removing water (H2O) and carbon dioxide (CO2) contained in said impure argon gas which has been cooled down by said cooling means through adsorption; and a rectification means for rectifying said impure argon gas which has been substantially freed of water and carbon dioxide by said decarbonating and drying means to substantially remove said low boiling point impurity components and said high boiling point impurity components, thereby obtaining pure argon gas.

An argon recovery and purification unit according to the present invention may be characterized in that said rectification means comprises a first rectification column for substantially removing said low boiling point impurity components from said impure argon gas and a second rectification column for substantially removing said high boiling point impurity components from the liquefied impure argon gas introduced here from said first rectification column.

Gases such as oxygen (O2), nitrogen (N2) and carbon monoxide (CO) and hydrocarbons such as methane (CH4) are usually contained as impurities in impure argon gas discharged from a silicon furnace. The present invention is characterized by including a rectification step of separating the impurities at the very low temperature side. In particular, hydrocarbons will be highly separated at this rectification step. Accordingly, there is no need of heating the discharged gas at high temperatures as in the catalytic reaction of hydrocarbons and it is therefore possible to reduce electricity for heating up or the likes. Furthermore, since there is no need to add oxygen (O2) necessary for this catalytic reaction once more into the discharged gas, the whole of the system can be simplified. In the prior art of injecting oxygen, it is necessary to add a slightly excess of oxygen in order to carry out the catalytic reaction completely, and it is necessary to further add a large amount of hydrogen gas (H2) subsequently in order to remove this excess of oxygen. According to the present invention, however, there is required only the amount of hydrogen gas (H2) for removing oxygen initially contained in the impure argon gas, with no need of such operations.

In order to separate argon and oxygen in the impure argon gas by rectification, many rectifying trays are required because their boiling points are about of the same degree (argon: −185.8° C. and O2:−182.9° C. at 1 atm, respectively). By the way, the amount of oxygen (O2) contained in the impure argon gas is small. Accordingly, this oxygen is removed as water by adding hydrogen gas in an amount slightly larger than one required in a complete reaction for reacting oxygen with hydrogen gas (H2) so that it is converted to water, and reacting the hydrogen gas with oxygen at low temperatures by use of a catalyst. H2O and CO2 among the remaining impurity components, which will be solidified at low temperature, are removed by adsorption, and the other impurity components are removed by the rectification means.

The rectification means comprises a first rectification column and and a second rectification column, low boiling point impurity components (N2, CO, H2, etc.) whose boiling points are lower than that of argon are substantially removed in the first rectification column and high boiling point impurity components (CH4,C2H6, etc.) whose boiling points are higher than that of argon are concentrated here and introduced into the second rectification column, and these high boiling point impurity components are substantially removed to obtain pure argon in the second rectification column.

BRIEF DESCRIPTION OF THE DRAWINGS

Now referring to the accompanying drawings, an embodiment of the present invention will be completely described in detail to further explain the present invention.

DETAILED DESCRIPTION OF THE INVENTION

Figure 1:
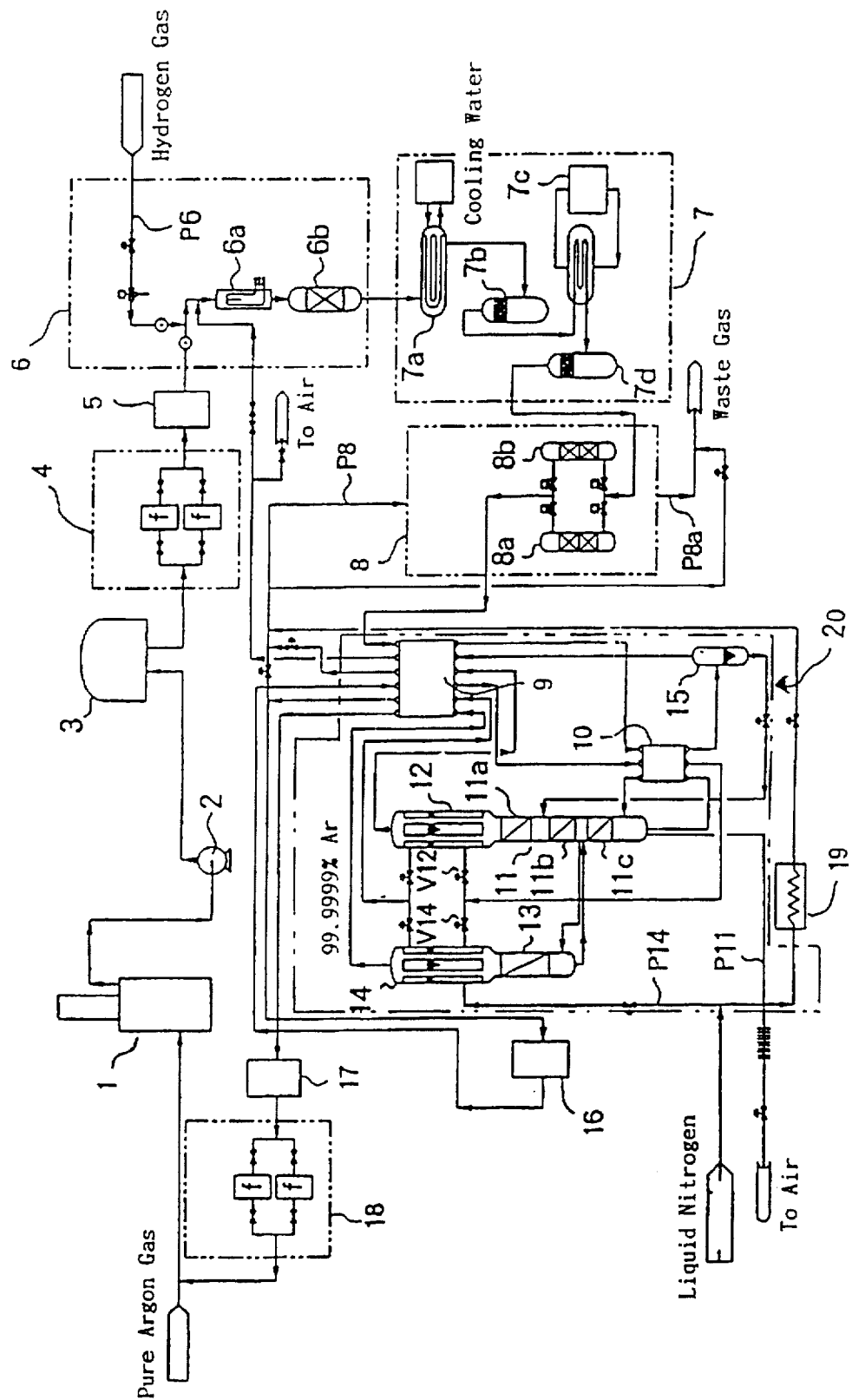
FIG. 1 is a flow chart showing the argon gas recovery and purification system according to the present invention.

This argon gas recovery and purification system has a line where discharged impure argon gas recovered from a silicon ingot pull-up furnace (1) by way of a vacuum pump (2) is purified for the same pull-up furnace (1). The argon recovery and purification line according to the present invention will be described in detail.

In a pressure-reduced silicon ingot pull-up furnace, a large amount of argon gas is used as its atmosphere gas. A vacuum pump is used in order to recover the argon gas which has been used, and as a result, hydrocarbons (CnHm) such as methane other than several percent of air (oxygen, nitrogen, etc.) get mixed as impurities in an amount of about 50 ppm, calculated as methane, in the argon gas. (This argon gas containing the mixed impurities will be hereinafter called "impure argon gas". A unit characterized by purifying and sepoarating impure argon gas by low temperature liquefaction to remove hydrocarbons (CnHm) from the argon gas, without adding O2 into hydrocarbons (CnHm) such as methane contained in this impure argon and elevating the temperature thereof at 400° C. or more so as to burn them to CO2 and H2O, whereby they are removed, is schematically shown in the flow sheet of FIG. 1. In accordance with this flow sheet, this unit will be explained.

Argon gas which has been used as an atmosphere gas in a silicon ingot pull-up furnace (1) is sucked by a vacuum pump (2) of the dry seal type, for example, of the mechanical seal type, and recovered as "impure argon gas" from the pull-up furnace (1) into a gas holder (3). The impure argon gas accomodated in the gas holder (3) is sucked in an amount according to an average amount of argon gas used in the pull-up furnace (1) by means of an impure argon gas compressor (5) so as to be introduced into a suction filter unit (4). Dust contained in the impure argon gas is removed in the suction filter unit (4). This suction filter unit (4) possesses at least a capacity of removing dust from the impure argon gas to such an extent that no hindrance exists for carrying out a continuous operation in a subsequent step. The impure argon gas filtered by the suction filter unit (4) is then introduced into an impure argon compressor (5), where it is pressurized to a pressure of 3.5~9.0 kg/cm²G. This pressure range covers a pressure at which a decarbonating drier mentioned below can be operated under optimum conditions. In the impure argon gas compressor (5), in addition, the temperature of the impure argon gas to be fed to a deoxo installation is also elevated by virtue of heat of compression. Then, the pressurized impure argon gas is sent to a deoxo installation (6).

The deoxo installation (6) is equipped with a heater (6a) and a deoxo column (6b). To the deoxo installation (6) is connected a flow-in line (P6) of hydrogen gas (H2) for deoxidation use coming from a hydrogen gas source. The deoxo column (6b) is filled with a catalyst for the deoxidation reaction such as Pd catalyt, where the reaction of oxygen (O2) contained in the impure argon gas introduced in the deoxo column (6b) with hydrogen gas (H2) for deoxidation use will be accelerated by means of the Pd catalyst. Further, the Pd catalyst serves to react carbon monoxide (CO) in the impure argon gas with O2 so that it is converted to CO2. Namely, the oxygen (O2) and carbon monoxide (CO) contained in the impure argon gas introduced in the deoxo column (6) are converted to other substances. (The impure argon gas which has been deoxidized by the deoxo installation (6) will be hereinafter called "deoxo argon gas".) Thus, O2 is substantially removed from the impure argon gas. In a case where the temperature of the discharged gas elevated in temperature by the impure argon compressor (5) does not reach a temperature suitable for the aforementioned deoxidation reaction, the heater (6a) will heat the impure argon gas to a predetermined temperature. This temperature is, for instance, nearly about 150° C. In addition, the flow rate of hydrogen to be fed to the deoxo column (6b) is regulated so that the amount of excessive hydrogen left after the reaction of oxygen and hydrogen in the deoxo column (6b) may be about 0.7%~1.5%.

The deoxo argon gas is then fed to a cooling installation (7). The cooling installation (7) comprises a water cooler (7a) corresponding to an after cooler of the impure argon compressor (5), separators (7b), (7d) for removing water condensed in the deoxo argon gas and a refrigerator (7c) for condensing water.

The deoxo argon gas is introduced into the water cooler (7a) and cooled down to about 40° C. here. Then, the cooled deoxo argon gas is introduced into the water separator (7b) placed at the outlet side of the water cooler (7a), where the condensed water is first separated Then, the deoxo argon gas is cooled down to about 10° C. by the refrigerator (7c). Also at the outlet side of the refrigerator (7c) is disposed the water separator (7d). Similarly in the water separator (7d), water condensed by the refrigerator (7c) is separated and removed from the deoxo argon gas.

A decarbonating and drying installation (8) comprises two adsorption columns (8a), (8b), each filled with a packing such as alumina or molecular sieve for adsorbing H2O and CO2. This decarbonating and drying installation (8) may be one where adsorption is carried out by utilizing the principle of pressure swing adsorption (PSA) or one where adsorption is carried out by utilizing the principle of temperature swing adsorption (TSA). In the decarbonating and drying installation (8), solidifiable components such as H2O and CO2 in the deoxo argon gas are adsorbed and separated to such a level necessary for the very low temperature separation in a demethanizing column mentioned below, and thus, they are removed from the deoxo argon gas. To the decarbonating and drying installation (8) is connected a line for supplying nitrogen gas for desorption of the adsorbed H2O and CO2 because an adsorption utilizing PSA or TSA is carried out. This nitrogen gas will be supplied from a line (P8) connected to a recycle nitrogen line mentioned below, and nitrogen gas containing the desorbed H2O and CO2 will be taken out of the decarbonating and drying installation (8) by way of a line (P8a) and discharged as a waste gas to the atmospheric air.

A heat exchanger (9), reboiler (10), argon rectification column (11), argon condenser (12), demethanizing column (13), pure argon condenser (14) and hydrogen separator (15) are accommodated in a cold box shown by an alternate long and two short dashes line 20 in FIG. 1, where the liquefied impure argon gas is treated as it is thermally interrupted from the outside.

The deoxo argon gas which has been freed of H2O and CO2 by adsorptive separation in the decarbonating and drying installation (8) is introduced into a countercurrent heat exchanger (9). In this countercurrent heat exchanger (9), the deoxo argon gas from the decarbonating and drying installation (8) is introduced in the same direction as the introducing direction of recycle nitrogen gas from a nitrogen compressor (16) mentioned below, and brought into countercurrent heat exchange with low pressure recycle nitrogen gas generated in an argon condenser (12) and pure argon condenser (14) mentioned below, waste gas generated in an argon rectification column (11) mentioned below, pure argon gas generated in a demethanizing column (13) and recovered hydrogen gas from a hydrogen separator (15) placed for recovery of hydrogen, so as to be respectively cooled down nearly to their dew points. Then, the deoxo argon gas cooled by the heat exchanger (9) is fed to a reboiler (10). In this reboiler (10), the deoxo argon gas is brought into heat exchange with liquefied pure argon gas so as to generate a reboiled gas, where the deoxo argon gas itself is liquefied.

The liquefied deoxo argon gas contains uncondensed gases still mixed therein such as a small amount of hydrogen. The liquefied deoxo argon gas at that time contains, for example, 1% of H2, 0.1% of N2 and 0.005% of CH4 as impurities, and comprises all the balance of argon. Then, this liquefied deoxo argon gas is led to the hydrogen separator (15). After the recovered hydrogen gas from the top portion of the hydrogen separator (15) is heated to normal temperature by the argon heat exchanger (9), it is released to the atmospheric air or returned to upstream of the heater (6a) of the aforementioned deoxo installation (6) so as to be utilized to reduce the amount of hydrogen used in the whole of the system.

From the bottom portion of the hydrogen separator (15), the liquefied deoxo argon gas is led to the upper portion of the argon rectification column (11) after it is reduced in pressure. In the argon rectification column (11), a reflux liquid generated in an argon condenser (12) placed on the top portion thereof and the reboiled gas generated in the reboiler (10) placed at the bottom portion thereof are repeatedly rectified at respective trays, where the low boiling point impurity components such as H2, N2 and CO are concentrated and argon is recovered in the upper portion (11a) of the rectification column (11), and the low boiling point impurity components such as H2, N2 and CO are separated and removed from the descending reflux liquid in the middle portion (11b) thereof. Thus, the argon gas is rectified to a purity level that is sufficient as a product. In the lower portion (11c) of the rectification column, high boiling point impurity components such as methane are concentrated in order to increase an argon recovery rate.

By concentrating the high boiling point components in the deoxo argon gas about several hundreds times and then separating them by liquid extraction from the bottom portion of the argon rectification column (11) by way of a line (P11), and by concentrating the low boiling point components such as H2, N2 and CO to about several ten times in the upper portion of the argon rectification column (11) and then separating them in a gaseous state, it is possible to obtain an argon recovery rate of 90~95%. The extracted gas from the lower portion (middle between the portions 11b and 11c) of the argon rectification column (11) is led to a demethanizing column (13) as it has been sufficiently freed of the low boiling point components such as H2, N2 and CO, in which after this extracted gas is rectified by a reflux liquid generated in a pure argon condenser (14) placed in the top portion of the demethanizing column (13) and high boiling point components such as methane are sufficiently removed by washing therefrom, it is extracted as pure argon gas from the top portion thereof. This extracted pure argon gas is warmed to normal temperature by the argon heat exchanger (9) mentioned above and then led to an argon compressor (17) mentioned below. After a reflux liquid generated in the pure argon condenser (14) placed in the top portion of the demethanizing column (13) recovers the high boiling point components at each rectifying tray, it is returned as a reflux liquid to the lower portion (11c) of the argon rectification column (11). In order to obtain a refux ratio necessary for this process, there is provided a recycle nitrogen line, where after recycle nitrogen is elevated in pressure by means of a recycle nitrogen compressor (16) to a pressure sufficient to condense in the reboiler (10) and cooled down in the argon heat exchanger (9), it is liquefied, with generating reboiled gas, in the reboiler (10). The liquefied recycle nitrogen gas is distributed by valves V12, V14 so that it is expanded to a pressure sufficient to evaporate through heat exchange in the argon condenser (12) and pure argon condenser (14) and a necessary reflux liquid is generated. After low-pressure recycle nitrogen gas evaporated in the argon condenser (12) and pure argon condenser (14) is warmed to normal temperature in the argon heat exchanger (9), it is elevated in pressure in the recycle nitrogen compressor (16) again. Cold necessary in this cold cycle is supplied as liquid nitrogen to the pure argon condenser (14) or argon condenser (12) so that its latent heat is effectively utilized in each of the condensers (14), (12) and its sensible heat is effectively utilized in the argon heat exchanger (9). Then, a part of the nitrogen gas is extracted from the low-pressure recycle nitrogen line and used as regeneration gas for the aforementioned decarbonating and drying installation (8), and the remaining part thereof is utilized in circulation in the low-pressure recycle nitrogen line. Nitrogen gas which is short in the low-pressure recycle nitrogen line will be replenished as liquid nitrogen through a pipe P14 from the outside. This liquid nitrogen will be used as regeneration gas for the decarbonating and drying installation (8) after its temperature is optionally made to be normal temperature through heat exchange with the atmospheric air in a heat exchanger (19). After the pure argon gas which has passed through the aforementioned steps is elevated in pressure to a predetermined pressure by a product argon compressor (17), and freed of dust particles contained therein to a level necessary for the silicon ingot pull-up furnace (1) by means of a product filter installation (18), it will be returned together with replenishment argon to the silicon ingot pull-up furnace (1) again.

Although an example using a vacuum pump (2) of the dry type, for example, of the mechanical seal, has been described, with referring to FIG. 1, the process according to the present invention can be optionally modified to various variants, for instance, such a variant that in a case where a vacuum pump of the oil seal type is used as the vacuum pump (2), impure argon gas is treated by adding after this vacuum pump (2) and before the deoxo installation (6), an installation for removing heavy pentane (C5+) or more heavy components which may clog the packings in the decarbonating and drying installation (8), of hydrocarbons (CnHm), and providing as the other means the same means as shown in FIG. 1.

EFFECTS OF THE INVENTION

According to the argon recovery and purification process of the present invention, as has been described above in detail, pure argon gas can be obtained by previously converting oxygen (O2) whose boiling point is very near to that of argon, of impurity components contained in impure argon gas, to water by a deoxo means, removing the same water by a decarbonating and drying means, and then highly separating the remaining impurity components by an argon rectification means. Thus, there are provided an argon recovery and purification process and unit in which the consumption of energy is small because of simple steps.

In a case where the rectification means comprises a first rectification column and a second rectification column, low boiling point impurity components (N2, CO, H2, etc.) whose boiling points are lower than that of argon are substantially removed in the first rectification column and high boiling point impurity components (CH4, C2H6, etc.) whose boiling points are higher than that of argon are concentrated here and introduced into the second rectification column, and further the high boiling point impurity components are substantially removed to obtain pure argon gas in the second rectification column. Accordingly, it is possible to obtain highly pure argon gas by a compact unit.

By using the argon recovery and purification process and unit according to the present invention particularly on impure argon coming from a silicon monocrystal furnace or the like, there are obtained the aforementioned remarkable effects.

We claim:

1. An argon recovery and purification process, which comprises purifying impure argon gas discharged from a silicon furnace and containing low boiling point impurity components selected from the group consisting of oxygen, nitrogen, and carbon monoxide, and whose boiling points are lower than that of argon, and high boiling point impurity components comprised of hydrocarbons whose boiling points are higher than that of argon to obtain substantially pure argon gas, and supplying said pure argon gas to the silicon furnace again, the process including:

a first step of adding hydrogen into said impure argon gas, and reacting said hydrogen with oxygen contained in the impure argon gas so as to be converted to water, thereby removing the oxygen from said impure argon gas;

a second step of introducing said impure argon gas into an adsorption means for adsorbing water and carbon dioxide contained in said impure argon gas, thereby removing the water and carbon dioxide from said impure argon gas; and a third step of subjecting said impure argon gas to a low temperature liquefaction and introducing liquefied argon gas into a rectification means which includes a first rectification column wherein said low boiling point impurity components are removed from said impure argon gas, and a second rectification column wherein said high boiling point impurity components are removed from said impure argon gas introduced from the first rectification column.

2. Process according to claim 1, wherein no oxidation step takes place prior to said first step.

3. Process according to claim 1, wherein fluid is taken from a point below a feed injection point of said first rectification column and the bottom of said first rectification column and is sent to the bottom of said second rectification column.

4. Process according to claim 1, wherein said first rectification column includes a bottom reboiler.

5. Process according to claim 1, wherein the first and second rectification columns each have a top condenser.

* * * * *